(12) United States Patent
Noda

(10) Patent No.: US 6,794,297 B2
(45) Date of Patent: Sep. 21, 2004

(54) METHOD FOR ETCHING AN ANTIREFLECTIVE COATING AND FOR FABRICATING A SEMICONDUCTOR DEVICE

(75) Inventor: Shuichi Noda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 178 days.

(21) Appl. No.: 10/084,192

(22) Filed: Feb. 28, 2002

(65) Prior Publication Data

US 2003/0032298 A1 Feb. 13, 2003

(30) Foreign Application Priority Data

Aug. 10, 2001 (JP) .................................. 2001-243275

(51) Int. Cl.[7] ........................................... H01L 21/302
(52) U.S. Cl. .................. 438/706; 438/709; 438/710; 438/714; 438/725
(58) Field of Search .................. 438/706, 709–715, 438/725

(56) References Cited

U.S. PATENT DOCUMENTS

| | | | | |
|---|---|---|---|---|
| 5,254,904 A | * | 10/1993 | Van De Leest et al. | .... 313/479 |
| 5,652,317 A | * | 7/1997 | McCulloch et al. | ........ 526/312 |
| 5,994,430 A | * | 11/1999 | Ding et al. | .................... 524/80 |
| 6,114,085 A | * | 9/2000 | Padmanaban et al. | ... 430/270.1 |
| 6,165,684 A | * | 12/2000 | Mizutani et al. | ......... 430/271.1 |

FOREIGN PATENT DOCUMENTS

| | | |
|---|---|---|
| JP | 08-083694 | 3/1996 |
| JP | 10-199868 | 7/1998 |
| JP | 2000-208497 | 7/2000 |
| JP | 2000-269184 | 9/2000 |
| JP | 2002-093778 | 3/2002 |

\* cited by examiner

Primary Examiner—Duy-Vu Deo
(74) Attorney, Agent, or Firm—Volentine Francos, PLLC (57) ABSTRACT

To determine an optimum addition ratio of ethyl alcohol in the etching gas in a plasma etching unit, an ethyl alcohol addition ratio at which the isotropic etching rate of the etching mask is obtained, and on the basis of the obtained ethyl alcohol addition ratio, the optimum addition ratio is determined, by performing an etching process using an etching gas containing ethyl alcohol in the optimum addition ratio, the portions of the bottom antireflective coating which are not covered with the etching mask are removed. Thus, it is possible to provide a novel etching method capable of appropriately removing unnecessary portions of the bottom antireflective coating which are not covered by photoresist without causing much damage to the photoresist used as the etching mask.

15 Claims, 5 Drawing Sheets

METHOD FOR ETCHING AN ANTIREFLECTIVE COATING AND FOR FABRICATING A SEMICONDUCTOR DEVICE

BACKGROUND OF THE INVENTION

1. Field of the Invention

The present invention relates to a method for forming an etching mask for a semiconductor integrated circuit by a photolithographic technology, and more particularly to an etching method by which to appropriately remove an antireflective coating formed under an etching-mask material to prevent reflected light when photographically patterning a resist layer to produce an etching mask.

2. Related Art

In the manufacture of a semiconductor device, a photolithographic technology is used. According to the photolithographic technology, a resist layer made of a photoresist material is formed on a layer to be processed, such as a metal layer, on top of a semiconductor substrate. After selectively exposed and then developed, unnecessary portions are removed from the resist layer, by which a resist mask is formed with a desired transfer pattern.

Through this resist mask as an etching mask, a metal layer for example, is etched by selective etching, and a wiring pattern corresponding to the desired pattern is formed by the remaining portion of the metal layer.

Meanwhile, with the growing density of the integrated circuits, in exposure of the photoresist, the deterioration of resolution by reflected light from the processing-object layer under the photoresist is becoming an increasingly serious problem.

To prevent the exposing rays from being reflected by the layer being processed in the exposure of the photoresist, a bottom antireflective coating (BARC) to absorb the light for exposure of the photoresist is disposed between the layer being processed and the photoresist, so that a decrease in the resolution caused by the reflected light is prevented.

However, after the photoresist is exposed and developed, when the processing layer is etched by using the bottom antireflective coating that covers the processing layer as an etching mask, the bottom antireflective coating needs to be removed without causing damage to the etching mask. Because the bottom antireflective coating is made of an organic material as the etching mask is, it is not easy to securely remove a portion of the bottom antireflective coating not covered by the etching mask without causing a substantial deformation in the etching mask.

JP-A-10-199868 discloses an etching method using a plasma etching unit. According to prior art described in the above publication, it is necessary to perform a first etching process that uses a mixed gas of oxygen, hydrogen bromide, carbon dioxide, and argon as an etching gas, and a second etching process that uses the same mixed gas as in the first, main etching process as an etching gas but uses the plasma etching unit in different operation conditions from those in the first etching process.

For the reason mentioned above, in the prior art, it is necessary to change over the operating conditions of the plasma etching unit.

An object of the present invention is to provide a novel etching method capable of appropriately remove unnecessary portions of a bottom antireflective coating not covered by photoresist without causing a substantial deformation to the photoresist as an etching mask and without changing over the operating conditions of the plasma etching unit.

Another object of the present invention is to provide an etching method capable of removing unnecessary portions of the bottom antireflective coating by desired etching characteristics by selecting operating conditions of the plasma etching unit.

SUMMARY OF THE INVENTION

The present invention adopts the following configuration to achieve the above object.

<Configuration>

According to the present invention, there is provided an etching method for, by a plasma etching unit, removing portions of a bottom antireflective coating not covered by an etching mask made of a photoresist material and having a desired shape for performing a selective etching process on a process-object film on a semiconductor substrate, the bottom antireflective coating being located between the process-object film and the photoresist material to prevent exposing rays from reflecting off the surface of the process-object film and traveling back up through the photoresist material when the photoresist material for forming the etching mask is selectively exposed to the rays to create the etching mask, comprising:

obtaining an ethyl alcohol addition ratio in a mixed gas not exhibiting isotropic etching characteristics to the etching mask by using a mixed gas of ethyl alcohol, oxygen and nitrogen as an etching gas in the plasma etching unit; and performing the etching process in the etching unit by using the etching gas, including ethyl alcohol, supplied at an addition ratio determined based on the obtained ethyl alcohol addition ratio to thereby remove the portions of the bottom antireflective coating not covered by the etching mask.

According to another present invention, there is provided an etching method for etching an antireflective film located under an etching mask made of a photoresist material, the method comprising: forming a first film over a semiconductor substrate, the first film being to be etched; forming the antireflective film on the first film; forming the etching mask on the antireflective film; removing portions of the etching mask to expose portions of the antireflective film; obtaining an ethyl alcohol addition ratio in a mixed gas not exhibiting isotropic etching characteristics to said etching mask by using mixed gas of ethyl alcohol, oxygen and nitrogen as an etching gas; and etching the exposed portions of the antireflective film by using said etching gas, including ethyl alcohol, supplied at an addition ratio determined based on said obtained ethyl alcohol addition ratio.

According to another present invention, there is provided a method for fabricating a semiconductor device, the method comprising: forming a first film over a semiconductor substrate, the first film being to be etched; forming an antireflective film on the first film; forming an etching mask made of a photoresist material on the antireflective film; removing portions of the etching mask to expose portions of the antireflective film; obtaining an ethyl alcohol addition ratio in a mixed gas not exhibiting isotropic etching characteristics to said etching mask by using mixed gas of ethyl alcohol, oxygen and nitrogen as an etching gas; etching the exposed portions of the antireflective film to expose portions of the first film by using said etching gas, including ethyl alcohol, supplied at an addition ratio determined based on said obtained ethyl alcohol addition ratio; and etching the exposed portions of the first film.

In the above-mentioned method according to the present invention, to remove unnecessary portions of the antireflective coating under the etching mask of a photoresist material on the bottom antireflective coating, a plasma etching unit same as those which have conventionally been used is used. In this plasma etching unit, as an etching gas, a mixed gas of ethyl alcohol, oxygen and nitrogen is used.

In the etching process using the above-mentioned etching unit, an ethyl alcohol addition ratio is obtained which does not show the above-mentioned mixed etching gas's isotropic etching characteristics to the etching mask. Theoretically, it is possible to remove the portions of the bottom antireflective coating which are not covered by the etching mask by performing the etching process by using the mixed gas containing ethyl alcohol supplied at the obtained addition ratio as mentioned above, in other words, by etching without directionality in the etching characteristics, more specifically, by etching with an isotropic etching rate of zero, in which case horizontal etching, or side etching, of the etching mask itself is prevented, with the result that the deformation of the etching mask in its horizontal direction can be suppressed to a minimum.

However, in the experiment, the inventor could observe an optimum etching effect that the deformation of the etching mask in its horizontal direction was minimum at an ethyl alcohol addition ratio that did not show isotropic etching characteristics to the etching mask, more specifically, at an ethyl alcohol addition ratio slightly larger than the ethyl alcohol addition ratio at which the isotropic etching rate was zero.

In one case, a mixed gas was used which contained ethyl alcohol supplied at an addition ratio 5% larger than the addition ratio at which the isotropic etching rate of the etching mask was zero. The ethyl alcohol addition ratio can be selected suitably based on the ethyl alcohol addition ratio that makes the isotropic etching rate zero.

For an ethyl alcohol addition ratio at which the isotropic etching rate of the etching mask is zero, the value of an ethyl alcohol addition ratio is adopted when the etching rate of the etching mask is zero under operating conditions that the high-frequency power source voltage of the plasma etching unit is 0 volt. The etching rate could be a negative value, and when it occurs, this means that polymer is deposited on the etching mask, which will be discussed later. Therefore, if this phenomenon is used positively, it is possible to increase the widths of the mask patterns by suitably changing the addition ratio based on the above-mentioned addition ratio that does not show the isotropic etching characteristics.

The photoresist material and the bottom antireflective coating may be formed by organic materials, and the process-object film may be formed by a silicide made of metal material such as tungsten, a silicon material or a compound of them.

An example of flow rates of a mixed gas of the etching unit is 35 ccm, 35 ccm and 30 ccm for oxygen, nitrogen and ethyl alcohol, respectively.

Detailed description will now be made of a preferred embodiment of the present invention in the following.

<Embodiment>

Figure 1:
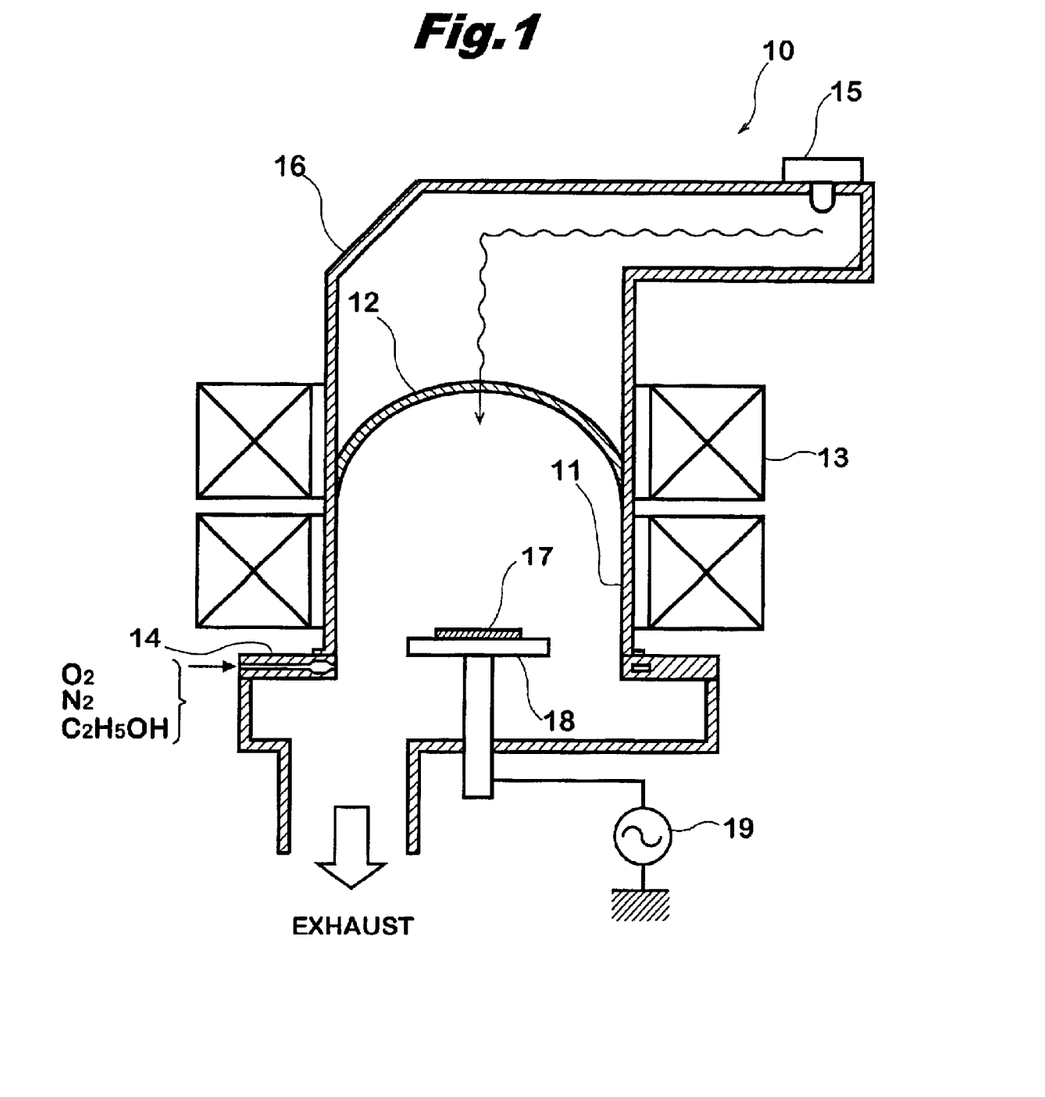
FIG. 1 is a drawing schematically showing a plasma etching unit according to the present invention.

FIG. 1 shows an example of etching unit for carrying out an etching method according to the present invention.

In the example of FIG. 1, an etching unit 10 according to the present invention is a magnetic-field-provided microwave plasma etching unit. The magnetic-field-provided microwave plasma etching unit 10, as has been well known, includes solenoid coils 13 arranged surrounding a quartz bell jar 12, which defines a reaction chamber 11.

An etching gas is supplied through a supply conduit 14 into the reaction chamber 11. To keep the etching gas in plasma state, microwaves emitted from a magnetron 15 are guided through a waveguide 16 into the reaction chamber 11, and a high-frequency voltage from a high-frequency power source 19 is applied to a sample holder 18, on which a sample 17 is placed, in the reaction chamber 11.

In an etching method according to the present invention, a mixed gas consisting of oxygen ($O_2$), nitrogen ($N_2$) and ethyl alcohol ($C_2H_5OH$) is supplied to the reaction chamber 11.

Figure 2:
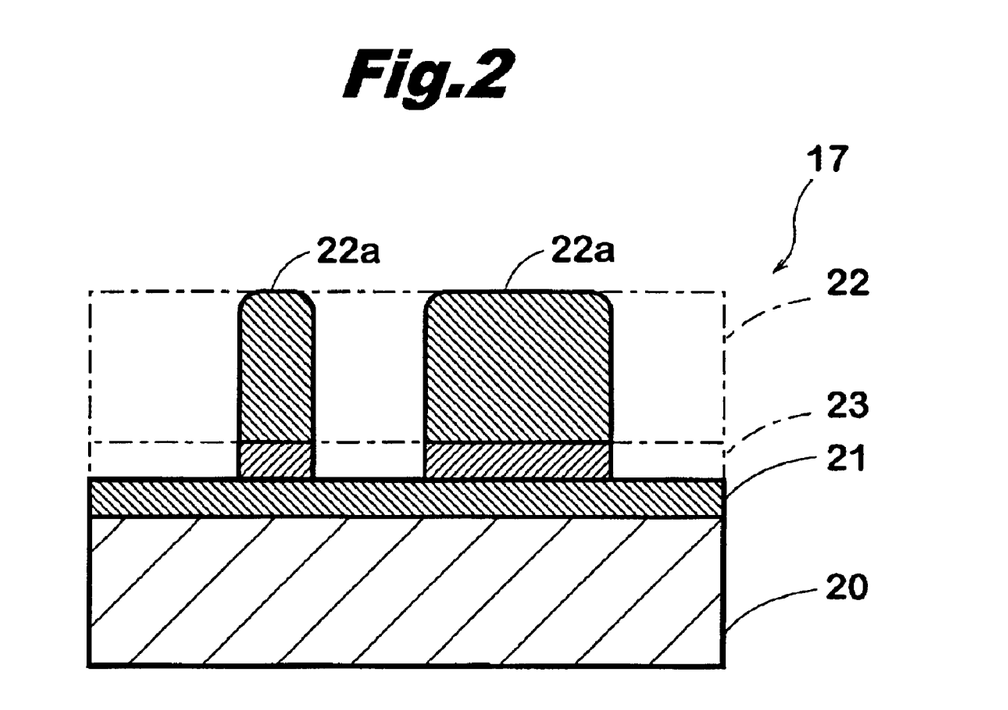
FIG. 2 is a sectional view showing an example of an etching mask formed by the etching method according to the present invention.

FIG. 2 shows an example of a semiconductor device to which an etching process is performed by using the above-mentioned mixed gas as an etching gas.

As shown in FIG. 2, a semiconductor device 17 disposed as a sample on the sample holder 18 includes a semiconductor substrate 20 made of silicon for example, and a process-object film subjected to patterning, such as a silicon dioxide film (Non-doped Silicate Glass) 21.

An etching mask 22a is used in a selective etching process to create a desired pattern in the process-object film, and is formed by performing a selective exposure and developing process on a photoresist film 22 of an organic photoresist material deposited on a well-known bottom antireflective coating 23 on the process-object film 21 and removing unnecessary portions of the photoresist film 22. In the selective exposure of the photoresist 22, the bottom antireflective coating 23 prevents the exposure rays from reflecting off the surface of the process-object film 21 and traveling back up to the photoresist layer 22. By this antireflective action of the bottom antireflective film 23, the resolution can be prevented from being deteriorated by the reflected rays and a good etching mask 22a can be formed.

The etching unit 10 is used to remove the portions of the bottom antireflective film 23 not covered by the etching mask 22a before the selective etching process of the process-object layer 22 by using the etching mask 22a. The semiconductor device 17 is loaded in the reaction chamber 11 such that the semiconductor substrate 20 is placed on the sample holder 18 to remove the unnecessary portions of the bottom antireflective film 23.

Prior to removal of the unnecessary portions of the bottom antireflective film 23 in the etching unit 10, an addition ratio of ethyl alcohol in the etching gas which caused a least deformation in the etching process in the etching unit 10 was obtained.

More specifically, a relation was obtained between the etching rate of the photoresist, namely, the etching mask 22a and the variation in the addition ratio of ethyl alcohol in the etching gas when the voltage Vp-p of the high-frequency power source 19 in the etching unit was 0 volt.

Figure 3:
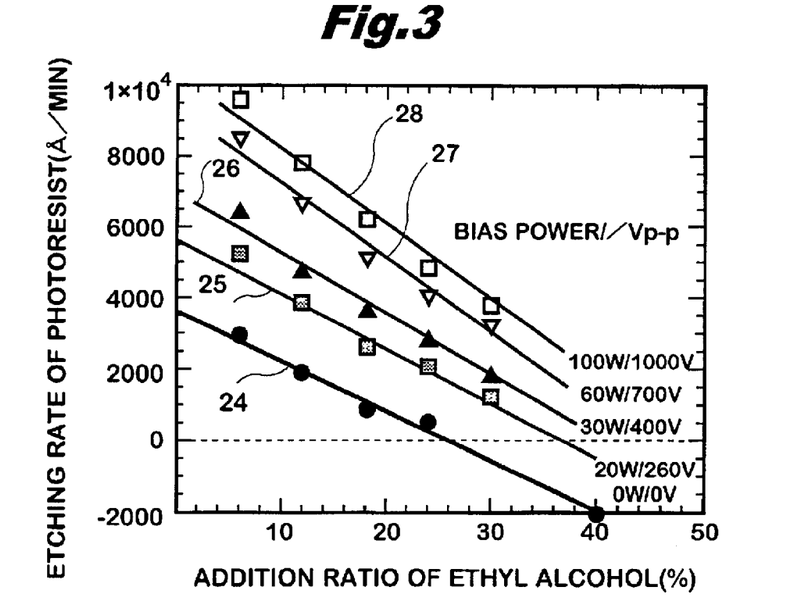
FIG. 3 is a graph (1) showing the relation between the addition ratio of ethyl alcohol in an etching gas used in a plasma etching process according to the present invention and the etching rate of photoresist, in which the high-frequency source voltage of the plasma etching unit is used as a parameter.

FIG. 3 shows the characteristic curves when the voltage Vp-p of the high-frequency power source 19 in the etching unit was 0 and also shows for reference the characteristic curves when the voltage Vp-p of the high-frequency power source 19 was varied.

The characteristic curves in FIG. 3 were obtained under the operating conditions of the etching unit 10 as follows. The current in the solenoid coils 13 was adjusted so that 45-GHz microwaves could be output at 500 W by the magnetron 15 and that an ECR resonance could be obtained with a magnetic field intensity of 875 gauss at a location about 50 mm above from the sample holder 18. The reaction chamber 11 was filled with helium gas at 7.5 Torr to control the temperature of the semiconductor device 17 on the sample holder 18. The interior of the reaction chamber 11 was maintained at 60° C. to prevent the deposition of polymer on the internal walls of the reaction chamber 11 and the sample holder was maintained at −50° C.

Ethyl alcohol ($C_2H_5OH$) was added so that the flow ratio of oxygen ($O_2$) and nitrogen ($N_2$), except for ethyl alcohol ($C_2H_5OH$), of the mixed gas were 1:1, and the pressure in the reaction chamber 11 was fixed at 10 mTorr so that the flow rate of the combined gas was fixed at 100 ccm.

Under the above-mentioned conditions, a relation was obtained between the addition ratio of ethyl alcohol ($C_2H_5OH$) and the etching rate of the photoresist as the etching mask 22a in which the voltage of the high-frequency power source 19 was parameter and when this voltage was varied from 0 V to 1000 V. The bottom antireflective coating 23 and the etching mask are both organic and their etching selectivity ratio was constantly 1.1 regardless of changes in the etching conditions. The thickness of the etching mask 22a and the thickness of the bottom antireflective coating 23, which were subjected to the etching process, were 4300 Å and 1100 Å, respectively.

In FIG. 3, the horizontal axis indicates values of the addition ratio (%) of ethyl alcohol and the vertical axis indicates values of the etching rate (A/sec) of the etching mask 22a. As the voltage Vp-p of the high-frequency power source as the parameter, 0 V, 260 V, 400 V, 700 V and 1000 V were adopted, and the characteristic curves at those voltages are denoted by codes 24 to 28.

As is obvious from the graph shown in FIG. 3, if the added amount of ethyl alcohol is equal, the etching rate of the etching mask 22a increases in proportion to changes in the voltage Vp-p. A situation that the etching rate is a negative value is shown in FIG. 3, which situation implies that polymer is deposited on the etching mask 22a.

In the plasma etching process using a mixed gas of oxygen ($O_2$), nitrogen ($N_2$) and ethyl alcohol ($C_2H_5OH$), chemical species involved in an etching reaction of an organic material, such as the etching mask 22a or the bottom antireflective coating 23 are dissociated oxygen radicals (O) and oxygen ions ($O^+$, $O_2^+$).

Of them, oxygen radicals provide the etching characteristics that do not exhibit directionality but show isotropy. On the other hand, oxygen ions, because they are accelerated by the voltage Vp-p of the high-frequency power source 19 and fall perpendicularly to the surface of the process-object film 21, provide the etching characteristics that exhibit anisotropy.

Under the condition that the voltage Vp-p of the high-frequency power source 19, which imparts anisotropy to the etching characteristics of the etching gas, is 0 volt, it is considered that only isotropic etching takes place during etching by the etching gas. Therefore, from the relation between the ethyl-alcohol addition ratio and the etching rate on the characteristic curve 24 when the voltage Vp-p is 0 volt, if an ethyl-alcohol addition ratio, at which the etching rate is zero, is adopted, even when the voltage Vp-p of the high-frequency power source 19 is increased, it is considered possible to perform the etching process with isotropic etching suppressed, in other words, by utilizing only directional, or anisotropic, etching characteristics.

As shown in the example of FIG. 3, by adopting an ethyl alcohol addition ratio of about 25%, at which the etching rate is zero, as shown by the characteristic curve 24, side etching of the etching mask 22a, in other words, etching of the etching mask 22a in its horizontal direction can be prevented. Therefore, under the condition that the etching mask 22a is, as described above, effectively prevented from being deformed, the portions of the bottom antireflective mask 22a which are not covered by the etching mask 22a can be removed.

However, the inventor, though the reason is not known, succeeded in effectively suppressing a substantial deformation of the etching mask 22a in the above example when an etching gas is supplied at an ethyl alcohol addition ratio of 30% (($O_2$)/($N_2$)/$C_2H_5OH$=35/35/30 ccm), which is 5% higher than the 25% ratio obtained from the characteristic curve 24.

Figure 4:
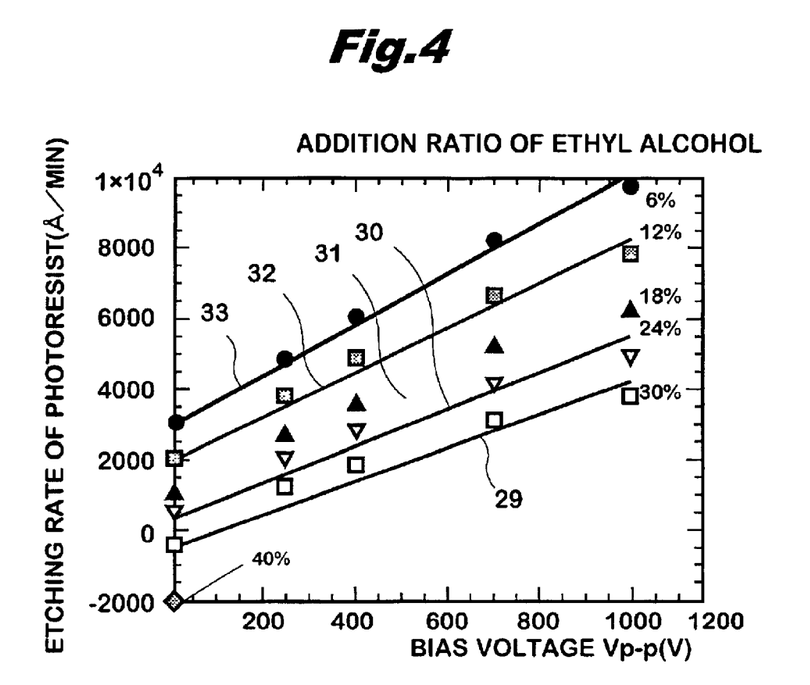
FIG. 4 is a graph (2) showing the relation between the high-frequency source voltage and the etching rate of the photoresist based on data of FIG. 3, in which the addition ratio of ethyl alcohol is used as a parameter.

The optimum value of the voltage Vp-p of the high-frequency power source 19 can be obtained from the graph in FIG. 4.

In FIG. 4, the graph (2) shows the relation between the high-frequency source voltage (Vp-p (V); horizontal axis) and the etching rate of the photoresist (Å/min; vertical axis) based on data of FIG. 3, in which the addition ratio of ethyl alcohol is used as a parameter.

In the graph in FIG. 4, codes 29–33 indicate the characteristic curves at 6%, 12%, 18% and 30% addition ratios of ethyl alcohol as the parameter.

As described above, when it is decided to use 30% addition ratio of ethyl alcohol, 5% higher than 25% obtained from the characteristic curve 24 in the graph of FIG. 3, from the relation of the characteristic curve 29 related to the 30% addition ratio of ethyl alcohol, it is possible to determine the value of the voltage Vp-p of the high-frequency power source, which enables the most effective removal of the bottom antireflective coating without causing damage to the process-object film 21.

The optimum example of the voltage Vp-p was 270 V that provided 20 W as the power of the high-frequency power source 19, and the etching process time at the above-mentioned voltage was 72 seconds with 20% over-etching taken into account.

In the above example, even if the etching mask 22a is a 0.15-μm fine wire pattern, the amount of deformation, or the critical dimension loss of the etching mask 22a by etching is not more than 0.005 μm.

In the above example, description has been made of a case where the process-object film 21 is made of silicon dioxide. Even if a silicide is used which is a chemical compound of silicon with a metal, or a high refractory metal, the bottom antireflective coating 23 on the process-object layer 21 can be removed effectively without causing damage to the process-object layer.

The above-mentioned etching gas in the present invention is advantageous in forming a minuscule hole of 0.44 μm in diameter, for example.

Figure 5:
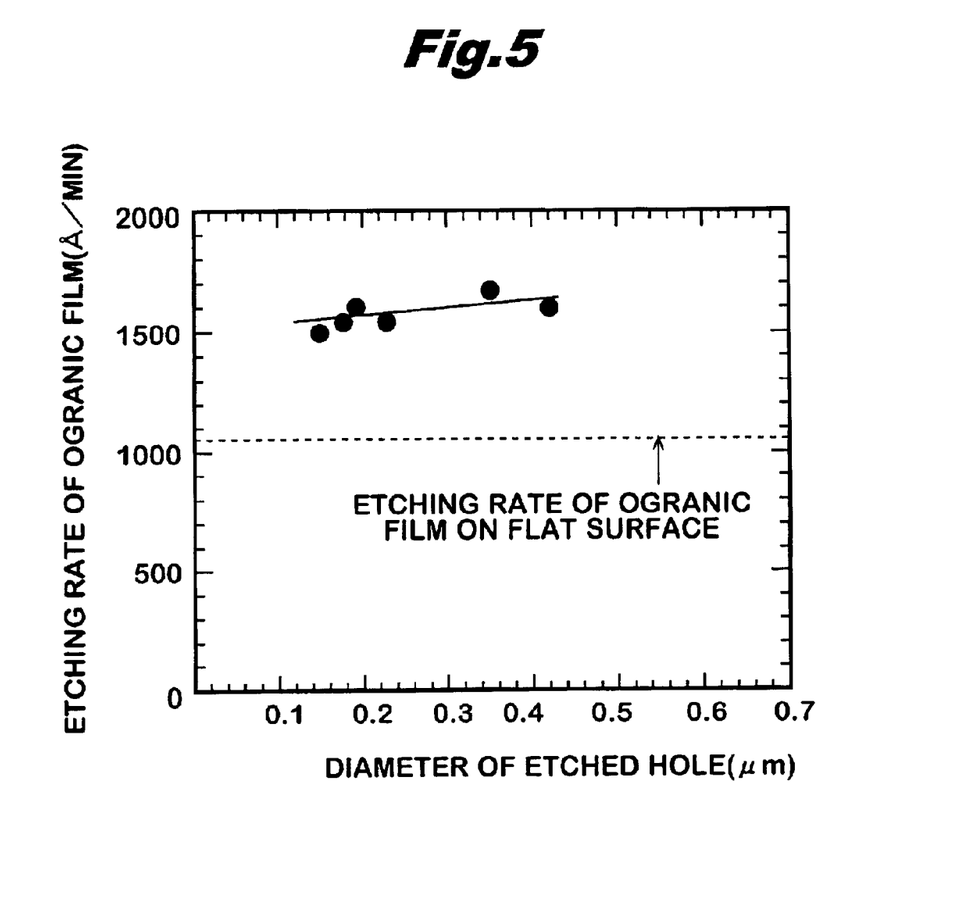
FIG. 5 is a graph (3) showing the relation between the diameter of an opening, formed by an etching method according to the present invention, through which the bottom antireflective coating is revealed.

FIG. 5 is a graph showing the relation between the diameter of an etched hole and the etching rate in the depth direction of the etched hole when a minuscule hole was formed in an organic material film similar to the bottom antireflective film by using the above-mentioned etching gas.

In the graph of FIG. 5, the horizontal axis indicates values of the hole diameter ($\mu$m) and the vertical axis indicates values of the etching rate (Å/min).

In the graph of FIG. 5, the broken line shows the level of the etching rate of the organic material film on its flat surface by using the above-mentioned etching gas.

As is apparent from the graph of FIG. 5, the etching rate when forming the minuscule hole with a diameter of 0.1~0.4 $\mu$m is about 1.5 times higher than that on the flat surface. Furthermore, this characteristic shows infinitesimal dependence on the hole diameter.

This characteristic is advantageous in removal of the portions of the bottom antireflective coating 23 not covered by the etching mask 22a when the space between two patterns 22a of the etching mask is very small. In other words, for example, in calculation of etching time for removal of the bottom antireflective coating 23 with a thickness of 1100 Å as mentioned above, for example, if the etching time is calculated from the etching rate on a flat surface and the result is 70 seconds, for example, this means that in etching the bottom reflective coating 23 using etching-mask patterns separated by a minuscule space, the etching can be finished in 50 seconds (including 20% over-etching), shorter than the required time calculated based on the rate on the flat surface.

Such a reduction in the etching process time is very important for protection of the etching mask 22a on the bottom antireflective coating 23.

Figure 6:
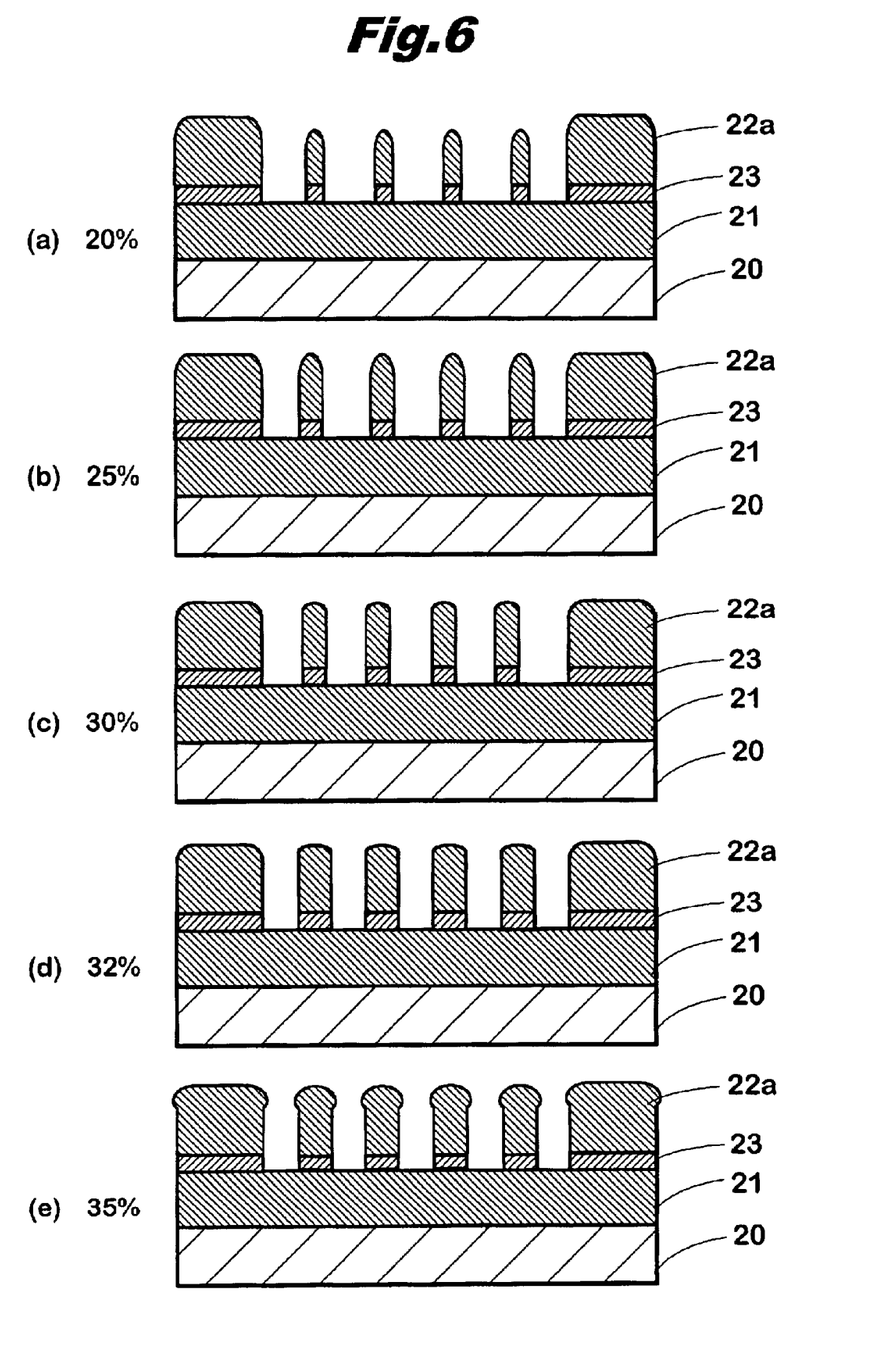
FIGS. 6(a)–6(e) are sectional views showing the addition ratios of ethyl alcohol and the degrees of change in the shape of the etching mask according to the present invention.

FIG. 6 shows the relation between the variation of the addition ratio of the above-mentioned ethyl alcohol ($C_2H_5OH$) and the degree of deformation of the etching mask 22a on the bottom antireflective coating 23 in the etching process in the etching unit 10 according to the present invention. The voltage Vp-p of the high-frequency power source 19 was maintained at its optimum value of 270 V and the operating conditions of the etching unit 10 other than the addition ratio of ethyl alcohol was the same as has been described with reference to FIG. 3.

In the example shown in FIG. 6(a), the addition ratio of ethyl alcohol was 20%, and in the examples of FIGS. 6(b), 6(c), 6(d) and 6(e), the ethyl alcohol addition ratio gradually increased to 25%, 30%, 32% and 35% in this order.

If one compares the width of the mask patterns 22a among FIGS. 6(a)–6(c) by observing from FIG. 6(c) to FIG. 6(a) in this order, he or she will understand that the mask patterns 22a become thinner as the ethyl alcohol addition ratio decreases.

On the other hand, they will also understand that as the ethyl alcohol addition ratio increases from FIG. 6(c) to FIG. 6(e), the width of the mask patterns 22a increases from FIG. 6(c) to FIG. 6(e) in this order.

The observation result coincides with the tendency of the graph in FIG. 3: when the bias voltage Vp-p is fixed at a certain value, as the ethyl alcohol addition ratio increases, the etching rate of the etching mask 22a to itself decreases and, conversely, beyond a certain value, polymer grows on the etching mask 22a.

Therefore, as described earlier, by suitably varying the ethyl alcohol addition ratio when necessary, the width of the mask patterns can be increased positively, by which it is possible to adjust the dimensions of the patterns of the etching mask 22a.

According to the etching method in the present invention, as has been described, to determine an optimum addition ratio of ethyl alcohol in the etching gas in the plasma etching unit, it is possible to obtain an ethyl alcohol addition ratio at which the isotropic etching rate of the etching mask to itself is zero, and on the basis of this obtained ethyl alcohol addition ratio, the optimum addition ratio can be determined. In an etching process using the etching gas containing the determined optimum addition ratio, the portions of the bottom antireflective coating which are not covered by the etching mask can be removed, so that unnecessary portions of the bottom antireflective coating can be removed while suppressing the horizontal deformation of the etching mask to a minimum.

According to the etching method of the present invention, it is possible to increase or decrease the horizontal dimensions of the etching mask based on the obtained ethyl alcohol addition ratio by suitably varying the ethyl alcohol addition ratio when necessity requires and therefore it is possible to positively cause the etching mask to be deformed and minutely adjust the dimensions of the patterns of the etching mask.

What is claimed is:

1. An etching method for, by a plasma etching unit, removing portions of a bottom antireflective coating not covered by an etching mask made of a photoresist material and having a desired shape for performing a selective etching process on a process-object film on a semiconductor substrate, said bottom antireflective coating being located between said process-object film and said photoresist material to prevent exposing rays from reflecting off the surface of said process-object film and traveling back up through said photoresist material when said photoresist material for forming said etching mask is selectively exposed to said rays to create said etching mask, comprising:

obtaining a first ethyl alcohol addition ratio in a mixed gas not exhibiting isotropic etching characteristics to said etching mask by using a mixed gas of ethyl alcohol, oxygen and nitrogen as an etching gas in said plasma etching unit; and performing said etching process in said etching unit by using said etching gas, supplied at a second ethyl addition ratio determined based on said first ethyl alcohol addition ratio, to thereby remove the portions of said bottom antireflective coating not covered by said etching mask.

2. An etching method according to claim 1, wherein operating conditions of said etching unit for obtaining said first ethyl alcohol addition ratio not exhibiting the isotropic etching characteristics are that a high-frequency power source voltage of said etching unit is 0 volt, and that an etching gas, including ethyl alcohol supplied at said second addition ratio based on said first ethyl alcohol addition ratio when an etching rate of said etching mask is zero under said operating condition.

3. An etching method according to claim 1, wherein said second addition ratio of ethyl alcohol included in said etching gas is set at a value about 5% higher than said first ethyl alcohol addition ratio.

4. An etching method according to claim 1, wherein said photoresist material and said bottom antireflective film are both made of an organic material, and wherein said process-object film is made of a metal or silicon material.

5. An etching method according to claim 1, wherein flow rates of said mixed gas are 35 ccm, 35 ccm and 30 ccm for oxygen, nitrogen and ethyl alcohol, respectively.

6. A method for etching an antireflective film located under an etching mask made of a photoresist material, the method comprising:

forming a first film over a semiconductor substrate, the first film being to be etched;

forming the antireflective film on the first film;

forming the etching mask on the antireflective film;

removing portions of the etching mask to expose portions of the antirefletive film;

obtaining a first ethyl alcohol addition ratio in a mixed gas not exhibiting isotropic etching characteristics to said etching mask by using mixed gas of ethyl alcohol, oxygen and nitrogen as an etching gas; and etching the exposed portions of the antireflective film by using said etching gas, supplied at a second ethyl alcohol addition ratio determined based on said first ethyl alcohol addition ratio.

7. An etching method according to claim 6, wherein operating conditions of a plasm etching unit for obtaining said first ethyl alcohol addition ratio not exhibiting the isotropic etching characteristics are that a high-frequency power source voltage of said etching unit is 0 volt, and that an etching gas, including ethyl alcohol supplied at said second addition ratio based on said first ethyl alcohol addition ratio when an etching rate of said etching mask is zero under said operating condition.

8. An etching method according to claim 6, wherein said second addition ratio of ethyl alcohol included in said etching gas is set at a value about 5% higher than said first ethyl alcohol addition ratio.

9. An etching method according to claim 6, wherein said photoresist material and said antireflective film are both made of an organic material.

10. An etching method according to claim 6, wherein flow rates of said mixed gas are 35 ccm, 35 ccm and 30 ccm for oxygen, nitrogen and ethyl alcohol, respectively.

11. A method for fabricating a semiconductor device, the method comprising:

forming a first film over a semiconductor substrate, the first film being to be etched;

forming an antireflective film on the first film;

forming an etching mask made of a photoresist material on the antireflective film;

removing portions of the etching mask to expose portions of the antireflective film;

obtaining a first ethyl alcohol addition ratio in a mixed gas not exhibiting isotropic etching characteristics to said etching mask by using mixed gas of ethyl alcohol, oxygen and nitrogen as an etching gas;

etching the exposed portions of the antireflective film to expose portions of the first film by using said etching gas, supplied at a second ethyl alcohol addition ratio determined based on said first ethyl alcohol addition ratio; and etching the exposed portions of the first film.

12. A fabricating method according to claim 11, wherein operating conditions of a plasma etching unit for obtaining said first ethyl alcohol addition ratio not exhibiting the isotropic etching characteristics are that a high-frequency power source voltage of said etching unit is 0 volt, and that an etching gas, including ethyl alcohol supplied at second addition ratio based on said first ethyl alcohol addition ratio when an etching rate of said etching mask is zero under said operating condition.

13. A fabricating method according to claim 11, wherein said second addition ratio of ethyl alcohol included in said etching gas is set at a value about 5% higher than said first ethyl alcohol addition ratio.

14. A fabricating method according to claim 11, wherein said photoresist material and said bottom antireflective film are both made of an organic material.

15. A fabricating method according to claim 11, wherein flow rates of said mixed gas are 35 ccm, 35 ccm and 30 ccm for oxygen, nitrogen and ethyl alcohol, respectively.

* * * * *